(12) United States Patent
Guezzi et al.

(10) Patent No.: US 8,742,310 B2
(45) Date of Patent: Jun. 3, 2014

(54) IMAGING DEVICE WITH HIGH DYNAMIC RANGE

(75) Inventors: Fadoua Guezzi, Grenoble (FR); Arnaud Peizerat, Grenoble (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 214 days.

(21) Appl. No.: 13/351,617

(22) Filed: Jan. 17, 2012

(65) Prior Publication Data

US 2013/0119233 A1 May 16, 2013

(30) Foreign Application Priority Data

Jan. 17, 2011 (FR) ...................................... 11 50364

(51) Int. Cl.
*H01L 27/146* (2006.01)
(52) U.S. Cl.
USPC ...................... 250/208.1; 250/214.1; 348/308
(58) Field of Classification Search
USPC .............................. 250/208.1, 214.1; 348/308
See application file for complete search history.

(56) References Cited

U.S. PATENT DOCUMENTS

| | | | |
|---|---|---|---|
| 7,545,044 B2 * | 6/2009 | Shibayama et al. | .......... 257/774 |
| 2002/0196170 A1 | 12/2002 | McIlrath | |
| 2005/0157202 A1 | 7/2005 | Lin et al. | |
| 2008/0083939 A1 | 4/2008 | Guidash | |
| 2008/0106635 A1 | 5/2008 | Lin et al. | |
| 2011/0163223 A1 | 7/2011 | Guidash | |

OTHER PUBLICATIONS

French Preliminary Search Report issued on Sep. 28, 2011 in corresponding French Application No. 11 50364 filed on Jan. 17, 2011 (with an English Translation of Categories).

* cited by examiner

*Primary Examiner* — Tony Ko
(74) *Attorney, Agent, or Firm* — Oblon, Spivak, McClelland, Maier & Neustadt, L.L.P.

(57) ABSTRACT

A high dynamic range imaging device including a first substrate with multiple pixels, each pixel having a photodetector associated with multiple read-out circuits. Each read-out circuit including a device for charging and discharging the photodetector that is associated with the read-out circuit. Each charging and discharging device being controlled by a charge and discharge activation signal imposing an integration time of the photodetector of each pixel associated with the read-out circuit. The device further including a second substrate, distinct from the first, with an electronic control circuit for controlling the charging and discharging devices, designed for generating multiple charge and discharge activation signals to be transmitted to the charging and discharging devices using electrical connections between the first and second substrates. Each pixel or group of pixels is associated to an activation signal imposing an integration time specific and appropriate to the pixel or group of pixels.

20 Claims, 4 Drawing Sheets

IMAGING DEVICE WITH HIGH DYNAMIC RANGE

This invention relates to a high dynamic range imaging device, or image sensor. It particularly applies to CMOS imagers based on a silicon technology with small sized pixels and capable of optical detection within the visible range.

A high dynamic range imaging device is an imager designed to be sensitive to an extended luminance dynamic range in an image acquired by its photosensitive sensors. The acquired image is neither overexposed in its areas of high luminous intensity nor underexposed in its areas of low luminous intensity. It contains detailed information in both of these types of extreme areas of the image.

An imaging device, designed as an integrated circuit, generally comprises:
 a first substrate to be exposed to the light, on which are positioned multiple pixels, for example arranged in an array, each pixel having a photodetector, and
 multiple read-out circuits associated with the multiple photodetectors, each read-out circuit comprising a device for charging and discharging at least one photodetector that is associated with this read-out circuit, each charging and discharging device being controlled by a charge and discharge activation signal.

These read-out circuits are more generally part of an electronic control circuit that is responsible for draining off the electrical information contained in each pixel, one by one, to the array output.

The photodetector of a pixel is responsible for converting the incident photon energy into electron-hole pairs. It is thus designed to accumulate an electrical charge between its terminals based on a luminous intensity received by the pixel during an exposure time, also called integration time in electronics, and to transmit this accumulated charge to the rest of the circuit in the form of a voltage that is reflective of this luminous intensity. The integration time is between a charging time, when the charging and discharging device controls the start of an accumulation of electric charge in the terminals of the photodetector, and a discharging time, when it controls the end of this accumulation of charge by resetting the voltage at the terminals of the photodetector to a reference voltage. In CMOS technology, the charging and discharging device is thus, for example, a field effect transistor controlled by an activation signal supplied to its gate.

To obtain a high dynamic range imaging device, it is possible to adjust two factors: the integration capacity at a given integration time or the integration time at a given integration capacity.

The "High dynamic range image sensors" presentation given at El Gamal at the IEEE 2002 International Solid-State Circuits Conference suggests an adjustment of the integration capacity. During a same integration cycle at a predetermined integration time, the activation signal of the charging and discharging device can take one or more non-binary values between 0 and 1 to adjust the integration capacity, which adjusts the slope of the charge store curve at the terminals of the photodetector according to the photonic current to avoid saturating the charge before the end of the cycle. Although this solution does not change the architecture of the substrate that supports the pixels and read-out circuits, it has two major disadvantages, namely providing a response that is not linear but rather piecewise linear and also having a loss of signal noise ratio (SNR). This causes problems in the nonlinear areas that are not defined in advance.

It then seems preferable to adjust the integration time. Such a solution is described in the article by Yang et al., titled "High dynamic range CMOS image sensor with conditional reset", published during the IEEE 2000 Custom Integrated Circuits Conference. It consists of repeatedly reading the accumulated charge in the terminals of a pixel's photodetector by measuring voltage in an integration cycle and, if necessary, conditionally resetting these read-outs. When the measured voltage reaches a predetermined threshold voltage, it is reset to the aforementioned reference voltage, and the reset time is saved in memory with the measured value. By judiciously choosing the successive read-out times and possible resets, particularly spaced at durations that are exponentially increasing by powers of 2, it is possible to use these successive read-outs to simply deduce a value for each determinable pixel in a wide dynamic range of values.

But this conditional reset solution is limited in its response speed because multiple successive read-outs are required, which is also energy intensive. In addition, the architecture of each pixel is necessarily modified by the introduction of specific electronic components that generate a conditional reset signal. Specifically, for a pixel with 3T architecture (i.e. a pixel with three-transistor CMOS technology), two transistors must be added in order to generate this signal. This reduces the pixel's performance in terms of its photosensitive surface.

An improvement to this solution is presented in the article by Acosta-Serafini et al., titled "A ⅓" VGA linear wide dynamic range CMOS image sensor implementing a predictive multiple sampling algorithm with overlapping integration intervals", published in IEEE Journal of Solid-State Circuits, vol. 39, no. 9, September 2004. According to this improvement, the successive read-outs are also subject to a condition. More specifically, they are conditionalized based on the light intensity of the given pixel. For a pixel that is dimly lit at a first read-out time, the integration cycle continues until ending without a new read-out. Above a first threshold, a second read-out is done, and the test is reproduced with a second threshold, and so on.

This solution involving read-outs and conditional resets speeds up the acquisition of the image, but it still relatively energy intensive. In addition, the architecture of each pixel remains necessarily modified by the introduction of specific electronic components that generate the read-out signal and conditional resets. Specifically, for a pixel with 4T architecture (i.e. a pixel with four-transistor CMOS technology), the article indicates that one transistor must be added in order to generate this signal. As in the previous example, this reduces the pixel's performance in terms of its photosensitive surface.

It may therefore be desirable to provide a high dynamic range imaging device that can overcome at least some of the above problems and constraints.

The invention therefore relates to a high dynamic range imaging device comprising:
 a first substrate to be exposed to the light, on which are positioned multiple pixels, each pixel having a photodetector, and
 multiple read-out circuits associated with the multiple photodetectors, each read-out circuit comprising a device for charging and discharging at least one photodetector that is associated with this read-out circuit, each charging and discharging device being controlled by a charge and discharge activation signal,
the imaging device further comprising a second substrate, distinct from the first substrate, on which there is an electronic control circuit for controlling said charging and discharging devices, designed for generating multiple charge and discharge activation signals to be transmitted to said charging and discharging devices, the second substrate being electrically connect to the multiple read-out circuits by means of a least one electrical connection between the charging and discharging devices and the electronic control circuit.

Thus, by moving the generation of the activation signals to be transmitted to the charging and discharging devices to a substrate other than the one with the pixels, it becomes possible to more finely adjust the integration time using a dedicated control circuit without having to change or add to the structure of the first substrate.

Optionally, the first and second substrates are stacked, and the multiple read-out circuits are on the first substrate, said at least one electrical connection comprising at least one of the elements of the set consisting of a through via achieved through the first and/or the second substrate, an electrically conductive ball electrically connecting an electrical contact from the first substrate to an electrical contact of the second substrate, an electrical contact of the first substrate bonded by molecular adhesion to an electrical contact of the second substrate and capacitive couplings between the respective electrical contacts of the first and second substrates.

Also optionally, the electronic control circuit comprises:
at least one element generating an activation signal, and
a block evaluating the integration time to be applied to the multiple pixels, designed to calculate and transmit an integration time parameter to each element generating an activation signal.

Also optionally, an imaging device according to the invention comprises a reference block designed to provide a base of reference integration time, and each element generating an activation signal comprises a circuit for generating an activation signal from the base of integration times supplied by the reference block and from the integration time parameter supplied by the evaluation block.

Also optionally, each integration time parameter, denoted EXP, received by each element generating an activation signal defines an integration time $T_{int}$ applied by the activation signal generated by this element, according to the following relation: $T_{int}=T_{ligne} \cdot 2^{N-EXP}$, où EXP$\epsilon\{0, \ldots, N\}$, $T_{line}$ being a minimum integration time and N being a maximum integer value taken by the integration time parameter.

This format of possible values for the integration times applied to the pixels allows for encoding using a mantissa and exponent for the high dynamic range value of each pixel, which guarantees not only the linearity of the pixel's response but also better data compression because it constitutes a first compression step itself.

Also optionally, the block evaluating the integration time is designed for calculating a new value for each integration time parameter based on a current value of each integration time parameter and of a current value of luminance for each pixel measured by each read-out circuit.

Also optionally, the electronic control circuit comprises one element generating an activation signal per pixel.

Also optionally, because the pixels are arranged into groups of pixels, such as blocks or macroblocks of pixels, the electronic control circuit comprises an element generating an activation signal per group of pixels.

Also optionally, the pixels are arranged in an array on the first substrate, and the electronic control circuit comprises multiple elements generating an activation signal, arranged in an array on the second substrate, each element generating an activation signal being connected to a pixel or group of pixels by means of an electrical connection between the first and second substrate.

Also optionally:
each read-out circuit comprises three transistors: a reset transistor, a follower transistor, and a line selection transistor, and
the charging and discharging device comprises the reset transistor.

Also optionally:
each read-out circuit comprises four transistors: a reset transistor, a transfer transistor, a follower transistor, and a line selection transistor, and
the charging and discharging device comprises the transfer transistor.

The invention will be better understood using the following description, given purely as reference and referring to the accompanying drawings, in which.

Figure 1:
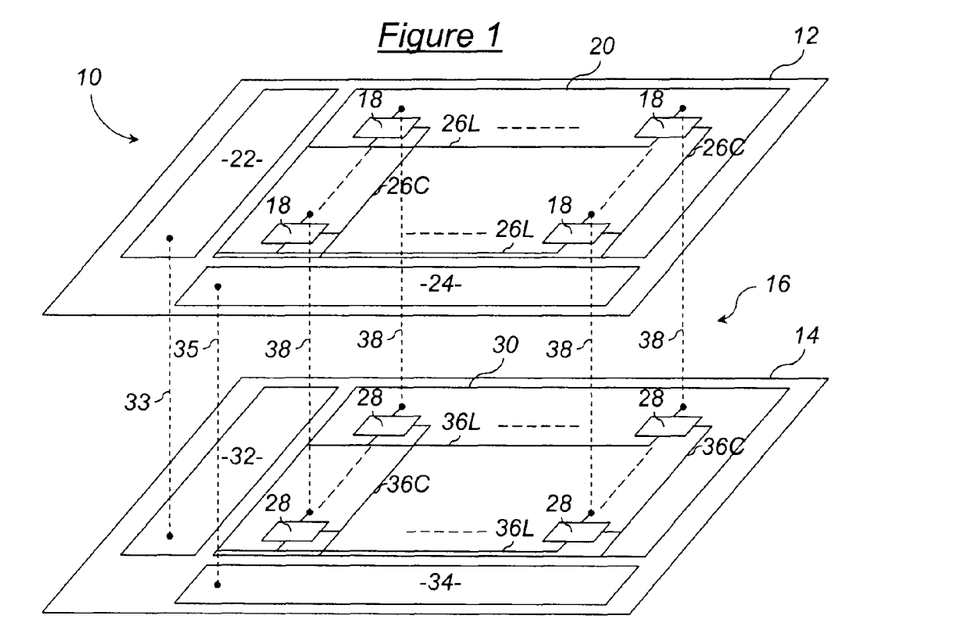
FIG. 1 schematically shows the general structure of a high dynamic range imaging device according to an embodiment of the invention, FIGS. 2 to 4 schematically show the general structure of a pixel of the imaging device in FIG. 1, according to three compatible embodiments of the invention, FIG. 5 schematically shows the general structure of an element generating an activation signal of the imaging device in FIG. 1, according to an embodiment of the invention.

The imaging device 10 shown in FIG. 1 comprises a first substrate 12 to be exposed to the light. It is, for example, designed based on CMOS technology, and the substrate 12 is made of a semiconductive material, such as silicon. It also comprises a second substrate 14, also made of silicon, stacked on the first substrate 12 and connected to it electrically by means of at least an electrical connection 16 between at least one element of the first substrate 12 and one element of the second substrate 14. This gives us an imaging device using 3D technology, presented in the form of a stack of several layers of integrated circuits, otherwise known as a 3D chip, each layer of the stack itself being known as a 2D chip.

Generally, the advantage of a 3D architecture resides, mainly:
for a large surface chip, in reducing the length of the interconnections between components, allowing for faster communication, and
for a device needing multiple chips, in increasing the number of interconnections between the chips, allowing communication that is no longer in series, but massively parallel.

In the example shown in FIG. 1, providing a non-exclusive example of a line-by-line image sensor according to the "rolling shutter" technique, this 3D architecture comprises an additional advantage, given the selected distribution of components of the imaging device 10 between the two substrates 12 and 14. Effectively, the traditional components based on capturing images from a 2D imaging device, such as pixels and their control circuits and associated read-out, are integrated onto the first substrate 12, while specific control components that can adjust the integration time of each pixel or group of pixels are integrated on a second substrate 14 to allow high dynamic range image. It thus becomes possible to design a 2D high dynamic range imaging device by more finely adjusting the integration time of each pixel using components integrated on the second substrate without having to change or add to the 2D conventional structure of the first substrate.

To do this, the first substrate 12 more specifically includes multiple pixels 18, regularly distributed in two mainly perpendicular directions, thereby forming an array 20 for detecting light, each pixel comprising a photodetector and an associated read-out circuit specifically comprising a charging and discharging device for this photodetector.

In the specific example in FIG. 1, it further includes the following components:

- a row selection block 22, arranged alongside rows of the array 20, designed to transmit to the array 20, via data transmission buses 26L each interconnecting a row of pixels, RS signals to trigger a read-out of the values of the pixels 18, row by row, using a "rolling shutter" technique,
- an analog/digital conversion block 24, located at the foot of columns of the array 20 to receive, via data transmission buses 26C each interconnecting a column of pixels, analog values read row by row, and to convert these analog values into digital values based on a predetermined format.

The second substrate 14 includes an electronic control circuit for controlling charging and discharging devices of photodetectors distributed on the first substrate 12, this electronic control circuit comprising the following components:

- multiple elements 28 generating activation signals evenly distributed along two main perpendicular directions, thus forming an array 30 generating activation signals for the charging and discharging devices of the first substrate, each element 28 comprising a memory for storing an integration time parameter and a circuit for generating an activation signal from a reference integration time base and from the integration time parameter,
- a reference block 32, arranged alongside the rows of the array 30 and connected to the row selection block 22 by an electrical connection 33, designed to supply the array 30, via data transmission buses 36L each interconnecting a row of elements 28, indication signals from the row-by-row reference integration time base,
- a block 34, connected to the analog/digital conversion block 24 by an electrical connection 35 to accept the value of the pixels and located at the foot of columns of the array 30, serving to evaluate the integration times to be applied to the array 20 of pixels 18, and transmitting to the elements 28 of the array 30, via data transmission buses 36C each interconnecting a column of elements 28, the new evaluated integration time parameters.

According to various possible embodiments, the row selection and analog/digital conversion blocks 22 and 24 are not necessarily on the first substrate 12 to be exposed to light. Either one of them can be on the second substrate 14 of even on at least one other substrate, such as an intermediate substrate wedged between the first and second substrate. Specifically, when at least one intermediate substrate is wedged between the first and second substrate to accept the blocks 22 and 24, and possibly the pixel read-out circuits, the assembly formed of the first substrate and the intermediate substrate(s) is as such a 3D chip of which only the first substrate is to be exposed to the light because it is the one with the photosensitive surface formed by the photodetectors. Note, however, that generally it is preferred to have the photodetectors and their associated read-out circuits on the same substrate due to constraints on the electrical interconnections between substrates.

In the specific example shown in FIG. 1, there are as many elements 28 generating activation signals on the second substrate 14 as there are pixels 18 on the first substrate 12. The electrical connection 16 then comprises multiple vertical electrical connections 38, each vertical electrical connection 38 connecting an element 28 of the second substrate 14 to a pixel 18 arranged side-by-side on the first substrate 12. The vertical electrical connections 38 are, for example, made up of through vias formed through the first and/or the second substrates, electrically conductive balls each electrically connecting an electrical contact of an element 28 to an electrical contact of a pixel 18, electrical contacts of elements 28 bonded by molecular adhesion to the electrical contacts of the pixels 18 or capacitive couplings between the elements 28 and the pixels 18. With these electrical connections 38, each elements 28 transmits the activation signal that it generates to the charging and discharging device of the corresponding pixel 18.

In one embodiment, there may be fewer elements 28 generating activation signals on the second substrate 14 than there are pixels on the first substrate 12, each element 28 sending its activation signal to a group of pixels, such as a block or macroblock of 2×2, 4×4, 8×8, 16×16, or 32×32 pixels. Moreover, and in combination with the above, in accordance with some 2D imaging architectures, it may be that the pixels 18 do not each have their own read-out circuit, these circuits being shared among multiple pixels. In this case, each element 28 generating an activation signal is associated with one or more charging and discharging devices of one or more read-out circuits, themselves associated with multiple pixels 18.

The first substrate 12 may comprise a very large number of pixels, millions or even tens of millions, in squares with dimensions of around 2 to 5 µm.

Figure 2:
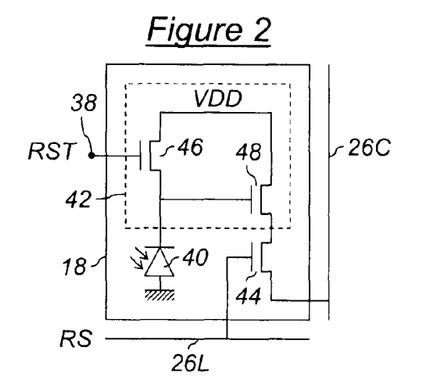

According to a first possible embodiment of pixels that is compatible with an implementation of the invention, any one of the pixels 18 is shown in FIG. 2 in accordance with a well-known architecture, known as a "3T" architecture, with analog electronics formed by three MOS transistors.

This 3T pixel comprises a photodetector, such as a photodiode 40, to convert incident photon energy received into electron-hole pairs. In one variant, the photodetector 40 could be a phototransistor.

It also comprises a read-out circuit 42 for reading the charges generated by the photodiode 40. This read-out circuit 42 comprises a circuit that provides the charge and discharge of the photodiode 40 and converts the charges generated by the photodiode 40 and stored in its junction capacitance during an integration time of the pixel 18.

Finally, the pixel 18 also comprises row selection means 44, making it possible to read luminance information stored by the pixel 18 during its integration time, upon receipt of the corresponding RS signal at the row where the pixel 18 is located and based on the value of the RS signal. The row selection means 44 are more specifically made up of an MOS transistor whose gate receives the RS signal.

The read-out circuit 42 comprises a first MOS transistor 46 whose source is connected to the photodiode 40 and the drain to a potential VDD. It further comprises a second MOS transistor 48 whose drain is also connected to the potential VDD and the source to the drain of the row selection transistor 44. In addition, the gate of the second transistor 48 is connected to the source of the first transistor 46.

The gate of the first transistor 46 is connected to one of the vertical connections 38 to receive the corresponding charge and discharge activation signal. The first transistor 46 thus constitutes the charging and discharging device of the photodiode 40 for this 3T pixel and can reset the pixel 18 when the first transistor 46 is set to an on-state, the voltage at the terminals of the junction capacitance of the photodiode 40 then being set to VDD. In this embodiment, the charging and discharging activation signal transmitted to the first transistor 46 is denoted RST.

The second transistor 48 forms a voltage follower and converts the charges stored in the junction capacitance of the photodiode 40 into a voltage.

Finally, when sending to the row where the pixel 18 is located, the row selection transistor 44 delivers the voltage supplied by the second transistor 48 on the bus 26 to which the pixel is connected 18 by setting the transistor 44 to an on-state using the RS signal.

Figure 3:
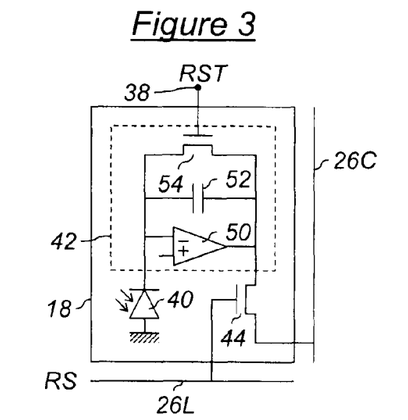

According to a second possible embodiment of the pixels that is compatible with an implementation of the invention, any one of the pixels 18 is shown in FIG. 3 in accordance with a well-known architecture, known as a "CTIA" architecture.

Like before, this CTIA pixel comprises a photodiode 40, a read-out circuit 42, and a line selection transistor 44.

But, unlike before, the read-out circuit 42 comprises an amplifier 50 whose negative input is connected to the photodiode 40 and the positive input to a source of bias voltage. The output of the amplifier 50 is connected to its negative input by means of a capacitance 52 and a MOS transistor 54, these two elements being connected in parallel to one another. The output of the amplifier 50 is also connected to the source (or to the drain, since the source and the drain are interchangeable) of the row selection transistor 44.

The gate of the transistor 54 is connected to one of the vertical connections 38 to receive the corresponding charge and discharge activation signal. The transistor 54 thus constitutes the charging and discharging device of the photodiode 40 for this CTIA pixel. Also in this embodiment, the charging and discharging activation signal transmitted to the transistor 54 is denoted RST.

In this second embodiment of the pixel 18, the voltage charges are converted by the assembly that includes the amplifier 50 and the capacitance 52.

Finally, when sending to the row where the pixel 18 is located, the row selection transistor 44 delivers the voltage supplied as output by the amplifier 50 on the bus 26 to which the pixel is connected 18 by setting the transistor 44 to an on-state using the RS signal.

Figure 4:
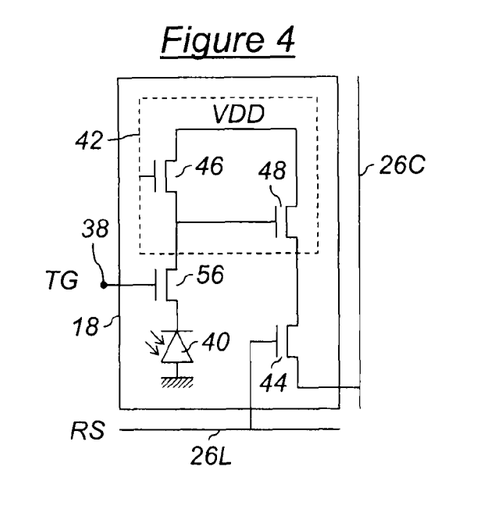

According to a third possible embodiment of pixels that is compatible with an implementation of the invention, any one of the pixels 18 is shown in FIG. 4 in accordance with a well-known architecture, known as a "4T" architecture, with analog electronics formed by four MOS transistors.

Like before, this 4T pixel comprises a photodiode 40, a read-out circuit 42, and a line selection transistor 44.

The read-out circuit 42 for this 4T pixel is identical to that of the 3T pixel in FIG. 2, except that there is a transfer transistor 56 between the source of the first transistor 46 and the photodiode 40.

This transfer transistor 56 provides insulation between the read-out circuit 42 and the photodiode 40, and it directly integrates the charges generated by the photodiode 40 when discharging its junction capacitance without having to reset the photodiode 40 to obtain the measure achieved by the pixel 18. More specifically, in its initial goal, it can carry out a correlated double sampling to eliminate the reset noise and the fixed pattern noise. For a high dynamic range imager, this can also be used to check the integration time.

The gate of the transfer transistor 56 is connected to one of the vertical connections 38 to receive the corresponding charge and discharge activation signal. The transfer transistor 56 thus constitutes the charging and discharging device of the photodiode 40 for this 4T pixel. In this embodiment, the charging and discharging activation signal transmitted to the transfer transistor 56 is denoted TG.

Finally, as in the previous embodiments, when sending to the row where the pixel 18 is located, the row selection transistor 44 delivers the voltage supplied by the second transistor 48 on the bus 26 to which the pixel is connected 18 by setting the transistor 44 to an on-state using the RS signal.

Figure 5:
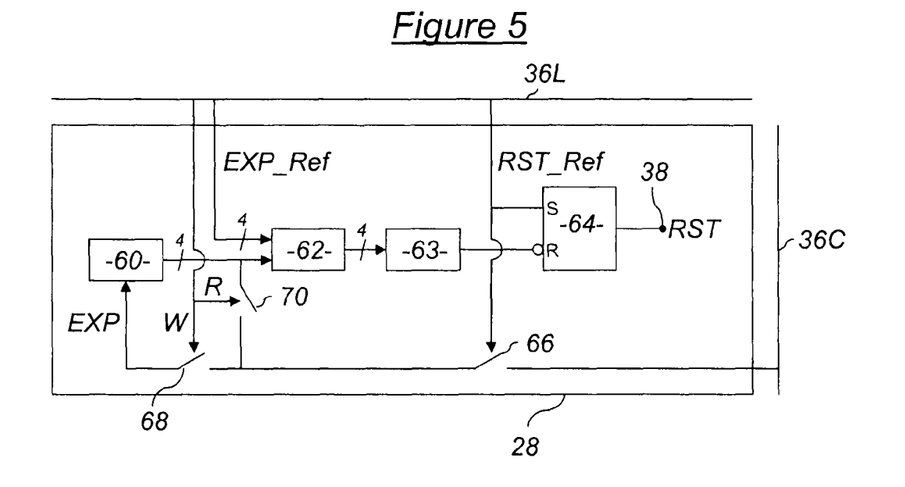

FIG. 5 schematically shows the general structure possible for an element 28 generating an activation signal of the imaging device 10, in accordance with an embodiment of the invention in which the imaging device 10 has as many elements 28 as pixels 18, in which the pixels 18 conform to the 3T pixel in FIG. 2, and in which the "rolling shutter" method is used for reading the array 20. But more generally, and as was shown with reference to FIGS. 3 and 4, the invention applies to any type of pixel, including CTIA and 4T pixels, by adjusting the transmission of the charge and discharge activation signals on a case-by-case basis. Similarly, the invention applies to any read-out method, including "rolling shutter" and "global shutter". Similarly, the invention applies to imagers whose each element 28 generating an activation signal sends its charge and discharge activation signal to multiple pixels 18.

The element 28 generating an activation signal in FIG. 5 comprises a memory 60 for storing an integration time parameter EXP and a circuit 62, 63, 64 for generating an RST activation signal to be sent to the corresponding pixel 18 by one of the vertical connections 38.

According to a possible embodiment of the invention, the integration time $T_{int}$ for a pixel can take multiple values identified by the EXP parameter, between a minimum value $T_{line}$, which corresponds to the minimum time needed for integrating it and reading the pixels on a line, and a maximum value $T_{image}$, which is equal to $L \cdot T_{line}$, where L is less than or equal to the number of lines in the array 20 of pixels 18. To facilitate the calculations and therefore the implementation, L is preferably a power of 2 and can be written as $L=2^N$. In this case, it is also practical for the integration time values to be the following:

$$T_{int} = T_{line} \cdot 2^{N-EXP} = \frac{T_{image}}{2^{EXP}}, \text{ where } EXP \in \{0, \ldots, N\}.$$

The value of the pixel 18 submitted at the integration time $T_{int}$ can therefore be expressed digitally as $M \cdot 2^{EXP}$, where M is the digital value returned by the analog/digital conversion block 24 from the voltage supplied when reading the pixel. M is called the mantissa of the pixel value, and EXP is its exponent. If, for example, M is encoded on 10 bits, the pixel dynamic becomes 10+N with N+1 possible integration times, and the EXP parameter can be encoded on fewer than N bits, i.e., on $E(\log_2 N)+1$ bits, where $E(\ )$ is the "integer part" function.

For example, for N=10, we get a pixel value that can be encoded on 14 bits with a dynamic of 20 bits, which constitutes a first data compression. In this case, the memory 60 can consist of a 4-bit SRAM memory for storing the integration time EXP parameter whose value is between 0 and 10.

The circuit generating the RST activation signal comprises an "exclusive or" bit-by-bit comparator 62 receiving, on a 4-bit bus, the value of EXP stored in memory 60 and, also on a bus of four bits, an EXP_Ref signal for supplying the various possible values of EXP. The output of the "exclusive or"

bit-by-bit comparator 62 is sent by a 4-bit bus to a logical port "or" 63 whose binary output remains "1" since EXP is not equal to the reference value supplied by the EXP_Ref signal and is "0" when the reference value is equal to the EXP value.

The output of the logical port "or" 63 is supplied as inverted input R to a classical RS flip-flop 64. The other input S of the RS flip-flop 64 receives a reference binary RST_Ref activation signal, that supplies as output of the RS flip-flop, as will be detailed with reference to FIG. 6, the binary RST activation signal adjusted to the value of EXP. The output of the flip-flop 64 is therefore connected to the vertical connection 38 that connects the element 28 to the corresponding pixel 18.

Figure 7:
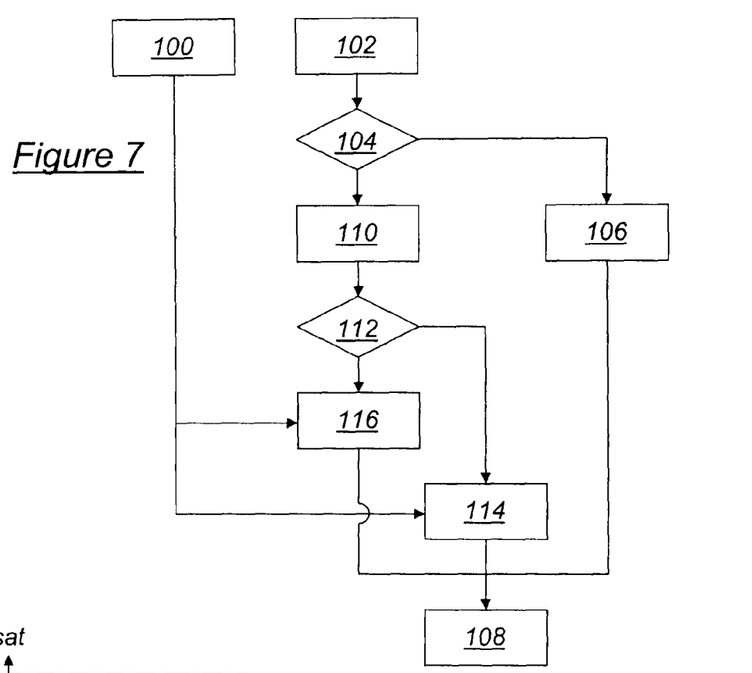
FIG. 7 shows the steps of a method implemented by an integration time evaluation block of the imaging device in FIG. 1, according to an embodiment of the invention, and FIG. 8 schematically shows the general structure of an embodiment of the evaluation block implementing the method in FIG. 7.

As will be detailed with reference to FIG. 7, the value of EXP is evaluated and updated by the evaluation block 34, such that the memory 60 of the element 28 generating an activation signal is readable and writable by the evaluation block 34 via the corresponding bus 36C. More specifically, within the element 28, the input for the memory 60 is connected to the bus 36C via a connection including a first switch 66 controlled by the RST_Ref signal and a second switch 68 controlled by a binary W signal that indicates precisely the correct time window for writing to the memory 60. Also within the element 28, the output from the memory 60 is connected to the bus 36C via a connection including the first switch 66 and a second switch 70 controlled by a binary R signal that indicates precisely the correct time window for reading in the memory 60.

The EXP_Ref, RST_Ref, W and R signals are supplied to the element 28 by the reference block 32 via the corresponding bus 36L. More specifically, EXP_Ref and RST_Ref constitute signals indicating the reference integration time base from which the element 28 is able to generate the appropriate RST activation signal, also using the integration time EXP parameter, and send it to the associated pixel 18. The RS signal generated by the row selection block 22 can also be used in the reference block 32 with the EXP_Ref, RST_Ref, W, and R signals. Based on the RS, EXP_Ref, RST_Ref, W, and R signals generated by the reference block 32, the operation of any one of the elements 28 generating a RST activation signal will now be detailed for N=3, provided only as an example and for a simple illustration, with reference to FIG. 6.

Figure 6:
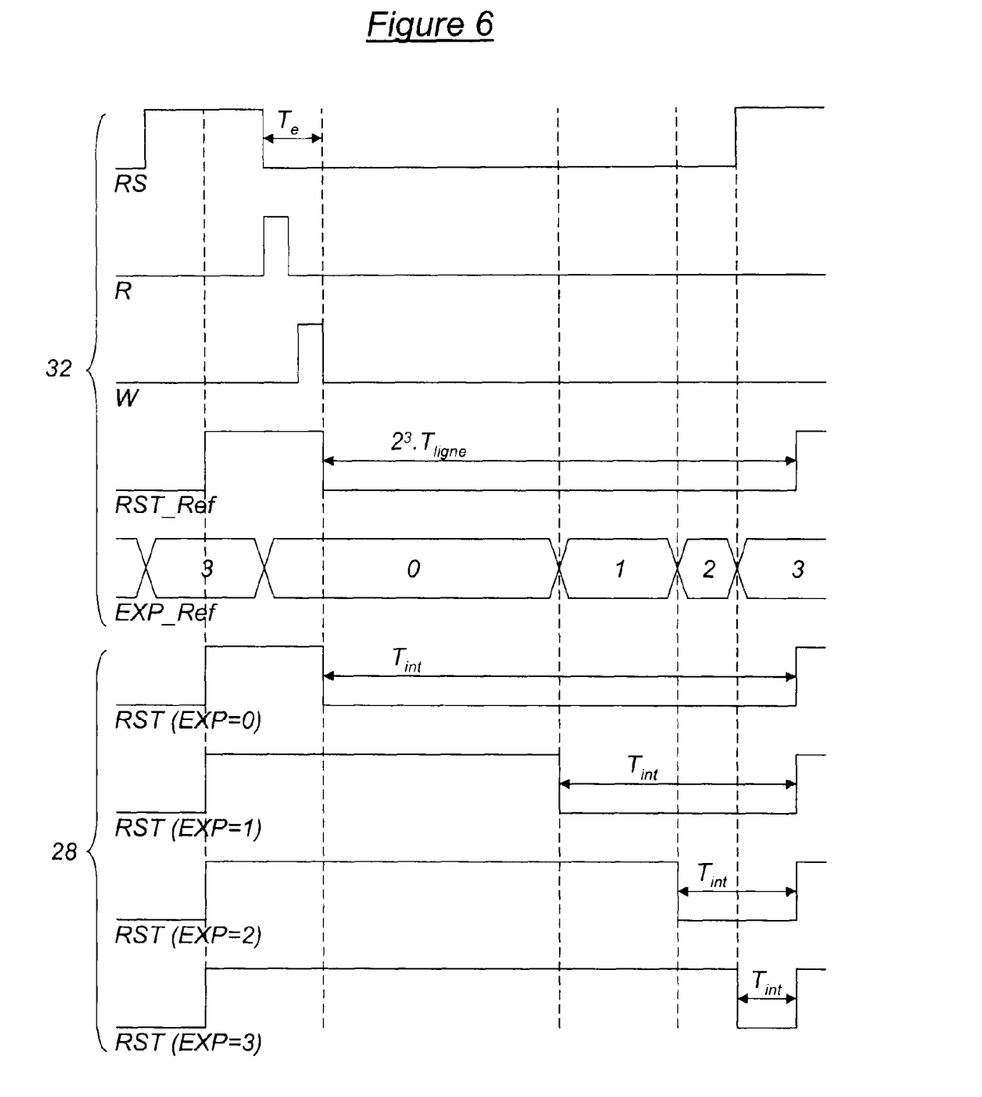
FIG. 6 shows diagrams to illustrate the generation of an activation signal by the element in FIG. 5.

The generation of the RST activation signal started by the element 28 is initially and indirectly triggered by the reference RS signal generated by the row selection block 22 changing from "1" to "0". From this point and for an evaluation duration $T_e$, during which the signal RST_Ref supplied by the reference block 32 is "1" (this keeps the switch 66 closed), the R and W signals become "1" so that the switches 70 and 68 are successively closed themselves and the evaluation block 34 can first read the current value of EXP in the memory 60 before generating and then writing a new value of EXP to the memory 60. Throughout this time, given the operation of the RS flip-flop 64, the RST signal takes the value "1". Alternatively, it is possible to anticipate reading the current value of EXP and to execute it before changing the RS signal to "0" by adjusting the R signal.

Following this evaluation, the RST_Ref signal takes the value "0", such that it compares the value of EXP with the value taken at each instant by the EXP_Ref signal that becomes determinant to set the value of the RST signal. This value "0" is held by RST_Ref for a duration of $2^3 \cdot T_{line}$ before changing back to "1". To form a reference integration time base with RST_Ref, the EXP_Ref signal is synchronized with RST_Ref to bring the value "0" when changing RST_Ref to "0", keeping this value "0" for a duration of $2^2 \cdot T_{line}$ before changing to "1", keeping this value "1" for a duration of $2 \cdot T_{line}$ before changing to "2", keeping this value "2" for a duration of $T_{line}$ before changing to "3", and then keeping this value "3" at least until the RST_Ref signal returns to "1".

This way, in this example where N=3, if the value stored in memory 60 of RST of "0", then when RST_Ref changes to "0", EXP=EXP_Ref, and the RS flip-flop 64 is configured so that RST changes to "0" and remains there as long as RST_Ref does not return to "1". Thus, we have $T_{int}=2^3 \cdot T_{line}=2^{3-EXP} \cdot T_{line}$.

If the value stored in memory 60 for RST is "1", then when RST_Ref becomes "0", $2^2 \cdot T_{line}$ must be reached before EXP=EXP_Ref. Thus, we now have $T_{int}=2^3 \cdot T_{line} - 2^2 \cdot T_{line} = 2^2 \cdot T_{line} = 2^{3-EXP} \cdot T_{lige}$.

If the value stored in memory 60 for RST is "2", then when RST_Ref becomes "0", $2^2 \cdot T_{line} + 2 \cdot T_{line}$ must be reached before EXP=EXP_Ref. Thus, we now have $T_{int}=2^3 \cdot T_{line} - 2^2 \cdot T_{line} - 2 \cdot T_{line} = 2 \cdot T_{line} = 2^{3-EXP} \cdot T_{line}$.

Finally, If the value stored in memory 60 for RST is "3", then when RST_Ref becomes "0", $2^2 \cdot T_{line} + 2 \cdot T_{line} + T_{line}$ must be reached before EXP=EXP_Ref. Thus, we now have $T_{int}=2^3 \cdot T_{line} - 2^2 \cdot T_{line} - 2^2 \cdot T_{line} - 2 \cdot T_{line} - T_{line} = T_{line} = 2^{3-EXP} \cdot T_{line}$.

Therefore, it clearly appears that the architecture detailed with reference to FIG. 5 of the element 28 allowing it to generate an activation signal appropriate and specific to the pixel to which it is associated from the integration time base supplied by the reference block 32 (RST_Ref signal combined with EXP_Ref) and from the integration time EXP parameter. By the same principle, the architecture of the element 28 will easily be adjusted to the various possible embodiments, based on the method for reading pixels, the value of N, and the various desired values for EXP.

The operation of the evaluation block 34 will now be described with reference to FIG. 7. In general, it is designed to adjust, at each read-out, the value of the integration time EXP parameter for each element 28 generating an activation signal for the actual luminosity for the corresponding pixel 18. For clarity purposes, this operation will be detailed for the processing of a single element 28.

Thus, during a step 100, the current value of the EXP parameter is read into the memory 60 of the element 28 via the corresponding bus 36C. During a step 102, the current value of the mantissa M of the corresponding pixel 18 is sent to the evaluation block 34 by the analog/digital converter 24 of the first substrate by means of a vertical connection. These current values may come from the last sequential read-out of the values of the array 20 of pixels 18 for updating the EXP parameter for the next read-out or from a preliminary read-out for the current read-out. Specifically, the preliminary read-out may consist of a first evaluation of the mantissa M after a minimum read-out time (ex. the duration $T_{line}$), a decision on adjusting the integration time being made while the integration of the pixel continues. Also alternatively, the mantissa values for several neighboring pixels can be used.

Then, during a step 104, a test is performed by the evaluation block 34 to determine whether the mantissa is saturated, means that all of its bits are set to "1". If this is the case, we then go to a step 106, during which the evaluation block 34 assigns the maximum value N to the EXP parameter, and then to a step 108, for writing this new value of EXP to the memory 60 via the bus 36C.

If the mantissa M is not saturated, the step 104 is followed by a step 110, during which the number Nz of successive most significant bits set to "0" of the mantissa is counted, starting from the most significant bit.

During an optional step 112, a test may be performed by the evaluation block 34 to determine whether the mantissa bits other than these Nz successive most significant bits set to "0" are all "1", meaning that the rest of the mantissa is saturated. If this is the case, we then go to a step 114, during which the evaluation block 34 subtracts the value Nz−1 from the EXP parameter, and then to a step 108, for writing this new value of EXP to the memory 60. Otherwise, we then go to a step 116, during which the evaluation block 34 subtracts the value Nz from the EXP parameter, and then to a step 108, for writing this new value of EXP to the memory 60. In an embodiment of the invention, the test step 112 is executed only for Nz=1.

To use an example to clearly show how this works, let's take M=0001101010, a 10-bit encoded mantissa, and EXP=4, the current value of the integration time parameter for N=10, corresponding to an integration time of $2^{10-4} \cdot T_{line}$. During the step 104, it is established that this mantissa M is not saturated. Then, during the step 110, Nz is estimated to be 3, since the first three most significant bits for the mantissa M are "0" and the fourth is "1". During the step 112, it is established that the rest of the mantissa M is not saturated. Thus, during the step 116, the EXP parameter is updated to the value 4−3=1.

Figure 8:
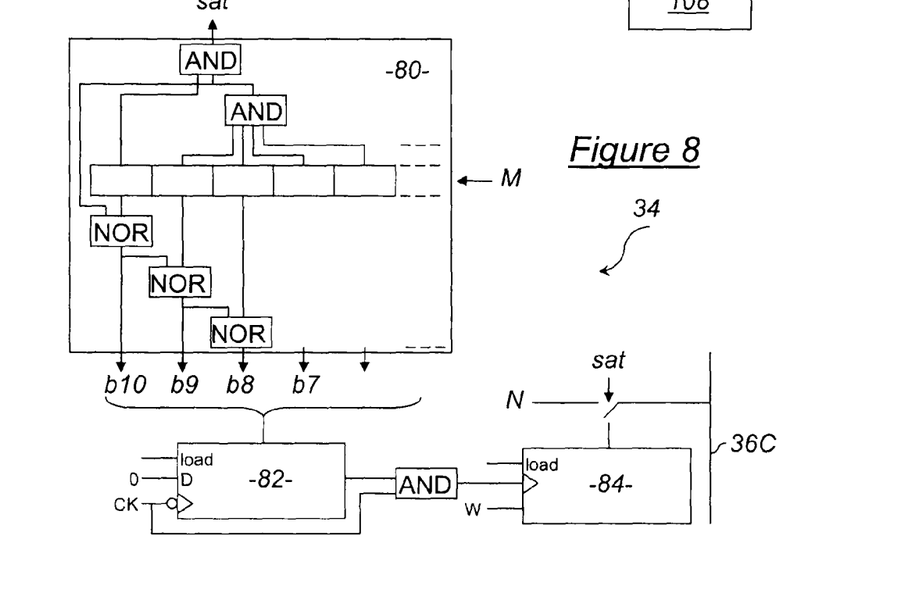

FIG. 8 schematically shows a possible implementation of the evaluation block 34, in accordance with the embodiment of the invention in which the imaging device 10 has as many elements 28 as pixels 18, in which the pixels 18 conform to the 3T pixel in FIG. 2, in which the "rolling shutter" read-out method is used for the array 20, and in which the test step 112 is executed only when Nz=1. But as before, this implementation can be easily adapted to any type of pixel, to any read-out method, and to imagers whose each element 28 generating an activation signal sends its charge and discharge activation signal to multiple pixels 18.

According to this implementation, the evaluation block 34 includes a module 80 for transcoding a mantissa, receiving a mantissa value M (equal to 10 bits in the example in FIG. 8) and using a combination of logical AND and NOR functions to supply a binary word of the same size, B=[b10, b9, . . . , b1] whose Nz most significant bits are "1" and the others are "0" (or the opposite if using OR instead of NOR). Moreover, two cascading logical AND functions provide a sat parameter whose value is "1" when the mantissa M is saturated.

The supplied binary word B is stored in a shift register 82, also receiving a clock signal CK as input, intended to generate at least 10 clock hits during the evaluation time $T_e$. As output of this offset register 82, a logical AND is used for a logical AND function between the output of the register and the clock signal CK. Thus, any bit set to "1" for B is a clock hit supplied as input from a counter 84 in which the current EXP parameter is stored, which subtracts a unit from the value of the EXP parameter each time. Finally, the EXP-Nz operation is carried out on the counter 84.

Finally, as output from the counter 84, a switch controlled by the sat parameter supplies the bus 36C, for updating EXP in the memory 60, either N if sat=1 or the new value of EXP stored in the counter 84 is sat=0.

Clearly, a high dynamic range imaging device such as is described above can benefit from new possibilities offered by the design of chips in stacked substrates, called 3D chips, to move the control adapting the integration time for each pixel or group of pixels to a substrate other than the one with the pixels and their associated read-out circuits. Thus, from a classic 2D imaginer architecture with a single substrate, it becomes easy to design a 3D high dynamic range imaging device without disrupting the performance of the initial 2D architecture, including in low light.

In addition, encoding the value of each pixel in the form of a mantissa and an exponent guarantees not only the linearity of the pixel's response but also better data compression because it makes up a first compression step itself.

Also note that the invention is not limited to the embodiments described above. As is known to those skilled in the art, there are various modifications that can be made to the embodiments described above, with respect to the instruction that has been disclosed.

Among other things, it was indicated that each element 28 generating an activation signal can be associated to a group of pixels, including a block or macroblock of pixels, each block or macroblock thus receiving its own RST signal. This makes it possible to implement the invention while relaxing the constraints on the vertical connections 38 and having smaller pixel sizes. Effectively, while an element 28 for generating an activation signal by pixel 18 is provided, there must be a space of at least 5 μm per pixel, this space being as low as 1.5-2 μm per pixel, for example, if we choose to have eight elements 28 for groups of 8×8 pixels.

In this case, after an evaluation by the evaluation block 34 of all of the integration time parameters for the pixels in each block, a single parameter per block is chosen. Advantageously, this is the maximum of EXP parameters in this block, corresponding to the minimum integration time. This choice offers better performance because none of the pixels in the block can be saturated. However, one disadvantage of applying an activation signal per block is making the effects of blocks appear when the blocks are too big. It is then necessary to select a block or macroblock size that is small enough so that these effects are not visible.

In the following claims, the terms used should not be interpreted as limiting the claims to the embodiments presented in this description, but should be interpreted to include all of the equivalents that the claims intend to cover by their formulation and whose projection is within reach of those skilled in the art by applying their general knowledge to the instruction that has just been disclosed.

Application areas that are particularly well-suited for an imaging device according to the invention are, for example, the automotive and video monitoring. However, it also applies to any other area that can use the high dynamic range property of an imager.

The invention claimed is:

1. A high dynamic range imaging device comprising on a first substrate to be exposed to light:
   multiple pixels, each pixel comprising a photodetector, and
   multiple read-out circuits associated with the multiple photodetectors, each read-out circuit comprising a device for charging and discharging at least one photodetector that is associated with this read-out circuit, each charging and discharging device being controlled by a charge and discharge activation signal (RST, TG) imposing an integration time of the photodetector of each pixel associated with the readout circuit,
   wherein it further comprises a second substrate, distinct from the first substrate, on which there is an electronic control circuit for controlling said charging and discharging devices, designed for generating multiple charge and discharge activation signals (RST, TG) to be transmitted to said charging and discharging devices by means of electrical connections between the first and second substrates, each pixel or group of pixels being associated to an activation signal imposing an integration time that is specific and appropriate to this pixel or group of pixels.

2. An imaging device according to claim 1, wherein the first and second substrates are stacked, said electrical connections comprising at least one of the elements of the set consisting of a through via achieved through the first and/or the second substrate, an electrically conductive ball electrically connecting an electrical contact from the first substrate to an electrical contact of the second substrate, an electrical contact of the first substrate bonded by molecular adhesion to an electrical contact of the second substrate and capacitive couplings between the respective electrical contacts of the first and second substrates.

3. An imaging device according to claim 2, wherein the electronic control circuit comprises:
multiple elements generating an activation signal (RST), each associated to a pixel or group of pixels, and
block evaluating the integration time to be applied to the multiple pixels, designed to calculate and transmit an integration time parameter (EXP), defining an appropriate integration time specific and appropriate to each element generating an activation signal.

4. An imaging device according to claim 2, wherein:
each read-out circuit comprises three transistors: a reset transistor, a follower transistor, and a line selection transistor, and
the charging and discharging device comprises the reset transistor.

5. An imaging device according to claim 2, wherein:
each read-out circuit comprises four transistors: a reset transistor, a transfer transistor, a follower transistor, and a line selection transistor, and
the charging and discharging device comprises the transfer transistor.

6. An imaging device according to claim 1, wherein the electronic control circuit comprises:
multiple elements generating an activation signal (RST), each associated to a pixel or group of pixels, and
block evaluating the integration time to be applied to the multiple pixels (18), designed to calculate and transmit an integration time parameter (EXP), defining an appropriate integration time specific and appropriate to each element generating an activation signal.

7. An imaging device according to claim 6, comprising a reference block designed to provide a base of reference integration times (EXP_Ref, RST_Ref) and in which each element generating an activation signal (RST) comprises a circuit for generating an activation signal (RST) from the base of integration times (EXP_Ref, RST_Ref) supplied by the reference block and from the integration time parameter (EXP) supplied by the evaluation block.

8. An imaging device according to claim 7, wherein each integration time parameter (EXP), noted EXP, received by each element generating an activation signal defines an integration time $T_{int}$ applied by the activation signal (RST) generated by this element (*), according to the following relation:

$T_{int} = T_{line} \cdot 2^{N-EXP}$, where $EXP \in \{0, N\}$, $T_{line}$ being a minimum integration time and N being a maximum integer value taken by the integration time parameter.

9. An imaging device according to claim 7, wherein the block evaluating the integration time is designed for calculating a new value for each integration time parameter (EXP) based on a current value of each integration time parameter (EXP) and of a current value of luminance for each pixel measured by each read-out circuit.

10. An imaging device according to claim 7, wherein the electronic control circuit comprises an element generating an activation signal per pixel.

11. An imaging device according to claim 7, wherein, because the pixels are arranged into groups of pixels, such as blocks or macroblocks of pixels, the electronic control circuit comprises one element generating an activation signal per group of pixels.

12. An imaging device according to claim 7, wherein the pixels are arranged in an array on the first substrate, and the electronic control circuit comprises multiple elements generating an activation signal, arranged in an array on the second substrate, each element generating an activation signal being connected to a pixel or group of pixels by means of an electrical connection between the first and second substrate.

13. An imaging device according to claim 6, wherein each integration time parameter (EXP), noted EXP, received by each element generating an activation signal defines an integration time $T_{int}$ applied by the activation signal (RST) generated by this element, according to the following relation:
$T_{int} = T_{line} \cdot 2^{N-EXP}$, where $EXP \in \{0, \ldots, N\}$, $T_{line}$ being a minimum integration time and N being a maximum integer value taken by the integration time parameter.

14. An imaging device according to claim 13, wherein the block evaluating the integration time is designed for calculating a new value for each integration time parameter (EXP) based on a current value of each integration time parameter (EXP) and of a current value of luminance for each pixel measured by each read-out circuit.

15. An imaging device according to claim 6, wherein the block evaluating the integration time is designed for calculating a new value for each integration time parameter (EXP) based on a current value of each integration time parameter (EXP) and of a current value of luminance for each pixel measured by each read-out circuit.

16. An imaging device according to claim 6, wherein the electronic control circuit comprises an element generating an activation signal per pixel.

17. An imaging device according to claim 6, wherein, because the pixels are arranged into groups of pixels, such as blocks or macroblocks of pixels, the electronic control circuit comprises one element generating an activation signal per group of pixels.

18. An imaging device according to claim 6, wherein the pixels are arranged in an array on the first substrate, and the electronic control circuit comprises multiple elements generating an activation signal, arranged in an array on the second substrate, each element generating an activation signal being connected to a pixel or group of pixels by means of an electrical connection between the first and second substrate.

19. An imaging device according to claim 1, wherein:
each read-out circuit comprises three transistors: a reset transistor, a follower transistor, and a line selection transistor, and
the charging and discharging device comprises the reset transistor.

20. An imaging device according to claim 1, wherein:
each read-out circuit comprises four transistors: a reset transistor, a transfer transistor, a follower transistor, and a line selection transistor, and
the charging and discharging device comprises the transfer transistor.

* * * * *